US011289136B1

(12) United States Patent
Tang et al.

(10) Patent No.: US 11,289,136 B1
(45) Date of Patent: Mar. 29, 2022

(54) MEMORY DEVICE AND ACCESS METHOD

(71) Applicant: Vanguard International Semiconductor Corporation, Hsinchu (TW)

(72) Inventors: Po-Yuan Tang, Hsinchu (TW); Jian-Yuan Hsiao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/081,673

(22) Filed: Oct. 27, 2020

(51) Int. Cl.
*G11C 7/10* (2006.01)
*G06F 12/06* (2006.01)

(52) U.S. Cl.
CPC .......... *G11C 7/1069* (2013.01); *G06F 12/06* (2013.01); *G11C 7/1096* (2013.01)

(58) Field of Classification Search
CPC ...... G11C 7/1069; G11C 7/1096; G06F 12/06
See application file for complete search history.

(56) References Cited

U.S. PATENT DOCUMENTS

| | | | | |
|---|---|---|---|---|
| 7,242,605 B2 * | 7/2007 | Choi | ........... | G11C 13/0064 365/148 |
| 7,525,864 B2 * | 4/2009 | Brown | ........... | G11C 7/1006 365/121 |
| 7,865,805 B1 | 1/2011 | Gallagher et al. | | |
| 7,920,413 B2 | 4/2011 | Yu et al. | | |
| 10,031,792 B2 | 7/2018 | Saito et al. | | |
| 2003/0005210 A1 | 1/2003 | Thummalapally et al. | | |

FOREIGN PATENT DOCUMENTS

TW           I490880 B        7/2015

OTHER PUBLICATIONS

Taiwanese Notice of Allowance and Search Report for Taiwanese Application No. 109128029, dated May 24, 2021.

* cited by examiner

*Primary Examiner* — Ajay Ojha
(74) *Attorney, Agent, or Firm* — Birch, Stewart, Kolasch & Birch, LLP (57) ABSTRACT

An access method for a memory device is provided. The access method includes receiving external data; reading a plurality of first memory cells of the memory device according to a write address to obtain first original data; comparing the external data and the first original data to determine whether the number of specific cells among the first memory cells is higher than a predetermined value, wherein the value of each of the specific cells would be changed from a first value to a second value in response to the external data being written into the first memory cells; and reversing the external data to generate reversed data and writing the reversed data into the first memory cells to replace the first original data in response to the number of specific cells being higher than the predetermined value.

20 Claims, 8 Drawing Sheets

MEMORY DEVICE AND ACCESS METHOD

BACKGROUND OF THE INVENTION

Field of the Invention

The invention relates in general to an access method, and in particular to an access method for a memory device.

Description of the Related Art

Generally, computer memory can be divided into two types: volatile memory and non-volatile memory. The most common types of volatile memory comprise dynamic random access memory (DRAM) and static random access memory (SRAM). The most common types of non-volatile memory comprise read-only memory (ROM), programmable ROM (PROM), erasable PROM (EPROM), electrically erasable PROM (EEPROM), and flash memory.

BRIEF SUMMARY OF THE INVENTION

In accordance with an embodiment, a memory device comprises a memory array; a read circuit reading a plurality of first memory cells of the memory array according to a write address to generate first original data; and a control circuit comparing external data and the first original data to determine whether the number of specific cells among the first memory cells is higher than a predetermined value, wherein the value of each of the specific cells would be changed from a first value to a second value in response to the external data being written into the first memory cells. In response to the number of specific cells not being higher than the predetermined value, the control circuit writes the external data to the first memory cells. In response to the number of specific cells being higher than the predetermined value, the control circuit reverses the external data to generate reversed data and writes the reversed data into the first memory cells.

In accordance with another embodiment, an access method for a memory device is provided. The access method comprises receiving external data; reading a plurality of first memory cells of the memory device according to a write address to obtain first original data; comparing the external data and the first original data to determine whether the number of specific cells among the first memory cells is higher than a predetermined value, wherein the value of each of the specific cells would be changed from a first value to a second value in response to the external data being written into the first memory cells; writing the external data to the first memory cells to replace the first original data in response to the number of specific cells not being higher than the predetermined value; and reversing the external data to generate reversed data and writing the reversed data into the first memory cells to replace the first original data in response to the number of specific cells being higher than the predetermined value.

Access methods for memories may be practiced by the systems of multi-dimensional measurement which have hardware or firmware capable of performing particular functions and may take the form of program code embodied in a tangible media. When the program code is loaded into and executed by an electronic device, a processor, a computer or a machine, the electronic device, the processor, the computer or the machine becomes a memory device for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
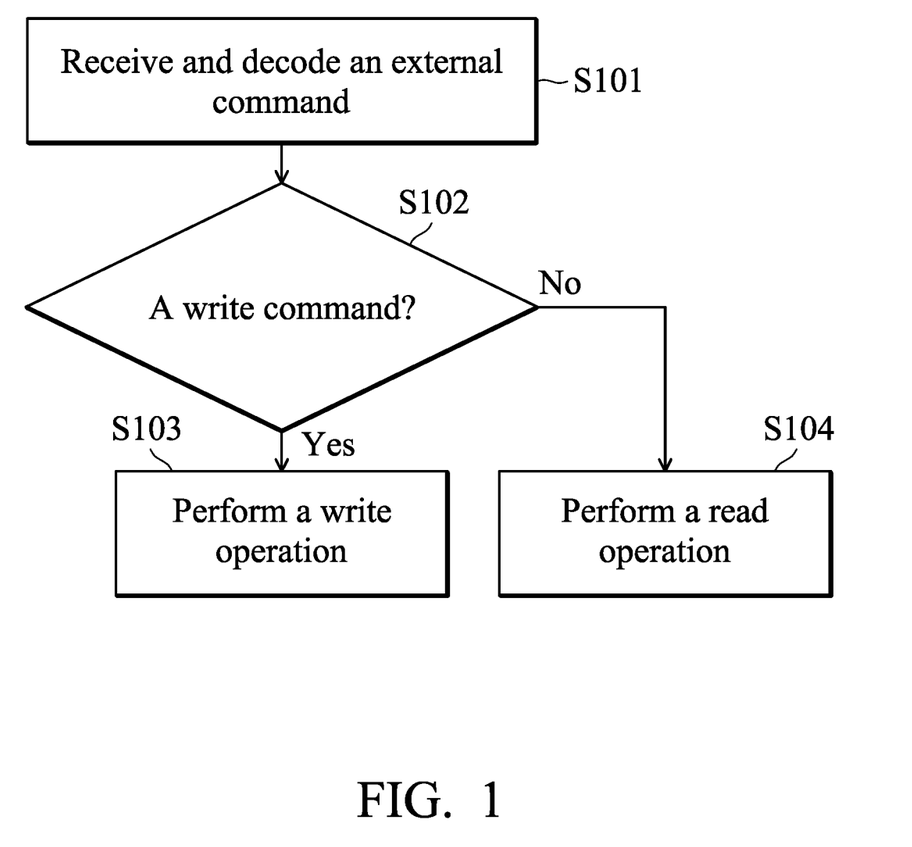
FIG. 1 is a flowchart of an exemplary embodiment of an access method according to various aspects of the present disclosure.

FIG. 1 is a flowchart of an exemplary embodiment of an access method according to various aspects of the present disclosure. The access method is applied to a memory device. The kind of memory device is not limited in the present disclosure. The memory device may be a volatile memory or a non-volatile memory. First, an external command is received and decoded (step S101). Then, the external command is determined whether to be a write command (step S102). When the external command is a write command, a write operation is performed (step S103). However, when the external command is not a write command, it means that the external command is a read command. Therefore, a read operation is performed (step S104). In this embodiment, the external command is decoded to generate a write address or a read address. The write address is utilized in the write operation. The read address is utilized in the read operation.

Figure 2:
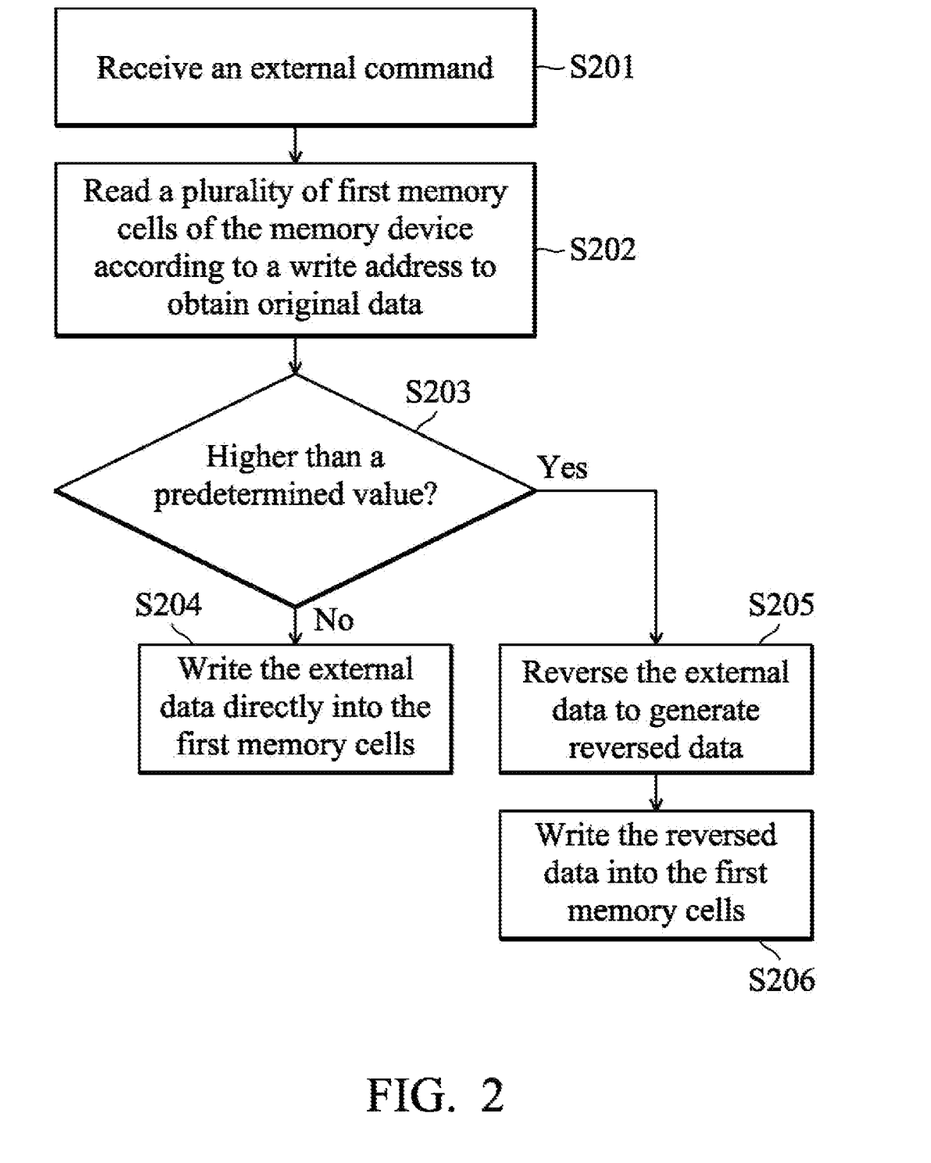
FIG. 2 is a flowchart of an exemplary embodiment of a write operation according to various aspects of the present disclosure.

FIG. 2 is a flowchart of an exemplary embodiment of a write operation according to various aspects of the present disclosure. First, external data is received (step S201). The format of external data is not limited in the present disclosure. In one embodiment, the external data is serial data or parallel data. Then, a plurality of first memory cells of the memory device are read according to a write address to obtain original data (step S202). In one embodiment, the first memory cells are coupled to the same word line and different bit lines. In this embodiment, the number of bits of the original data is the same as the number of bits of the external data.

The external data is compared with the original data to determine whether the number of specific cells among the first memory cells is higher than a predetermined value (step S203), wherein the value of each of the specific cells would be changed from a first value to a second value in response to the external data being written into the first memory cells. In this embodiment, the first value is different from the second value. For example, the first value is 0, and the second value is 1. In another embodiment, the first value is 1, and the second value is 0. In other embodiments, the predetermined value is a value which is a half of the number of bits of the external data. For example, when the number of bits of the external data is 4, the predetermined value may be 2.

When the number of specific cells among the first memory cells is not higher than the predetermined value, the external data is directly written into the first memory cells to replace original data stored in the first memory cells (step S204). For example, assume that the external data is 0001, and the original data is 0000. In this case, since the external data has 4 bits, the predetermined value may be 2. After the external data is compared with the original data, it is known that the original data has 1 bit (e.g., the least significant bit (LSB) would be changed from 0 (referred to as the first value) to 1 (referred to as the second value) when the external data is written into the first memory cells. Therefore, the external data (0001) is directly written into the first memory cells to replace the original data (0000). At this time, the data stored in the first memory cells is the same as the external data.

However, when the number of specific cells among the first memory cells is higher than the predetermined value, the external data is reversed to generate reversed data (step S205) and the reversed data is written into the first memory cells to replace the original data (step S206). At this time, the data stored in the first memory cells is opposite with the external data. For example, assume that the external data is 1111, and the original data is 0000. In this case, there are 4 bits, which would be changed from the first value to the second value in response to the external data being written into the first memory cells, in the original data. Since the number of specific cells which would be changed from the first value to the second value in response to the external data being written into the first memory cells is higher than the predetermined value (e.g., 2), the external data (1111) is reversed to generate reversed data (0000) and then the reversed data (0000) is written into the first memory cells. Since the reversed data is the same as the data stored in the first memory cells, the data of the first memory cells has not been changed. Therefore, the number of writing times of the first memory cells is reduced to increase the life of the memory cells.

To indicate that the data stored in the first memory cells has been reversed, step S205 further sets the data stored in a first reverse cell to the second value. In this case, the first reverse cell is also coupled to the first word line. For example, when the external data is 1111, and the original data is 0000, although the data stored in the first memory cells is not changed, the data stored in the first reverse cell is set to the second value (e.g., 1) to represent that the data stored in the first memory cells is the reversed data. Therefore, when an user directs to read the data stored in the first memory cells, a read circuit (not shown) of the memory device first reads the data stored in the first reverse cell to determine whether to reverse the data stored in the first memory cells. For example, when the data stored in the first reverse cell is a value 1, the read circuit first reverses the data (0000) stored in the first memory cells to generate the reversed data (1111). Then, the read circuit outputs the reversed data (1111). However, when the data stored in the first reverse cell is a value 0, the read circuit directly outputs the data stored in the first memory cells.

In some embodiments, step S204 further sets the data stored in the first reverse cell to the first value (e.g., 0). For example, assume that the external data is 0001, and the original data is 0000. Since there is 1 bit, which would be changed from 0 to 1 in response to the external data being written into the first memory cells, the external data is directly written into the first memory cells, and the data of the first reverse cell is set to the first value to represent that the data stored in the first memory cells does not need to be reversed. Therefore, when an user directs to read the data stored in the first memory cells, a read circuit (not shown) directly outputs the data stored in the first memory cells according to the data (e.g., a value 0) of the first reverse cell.

Figure 3:
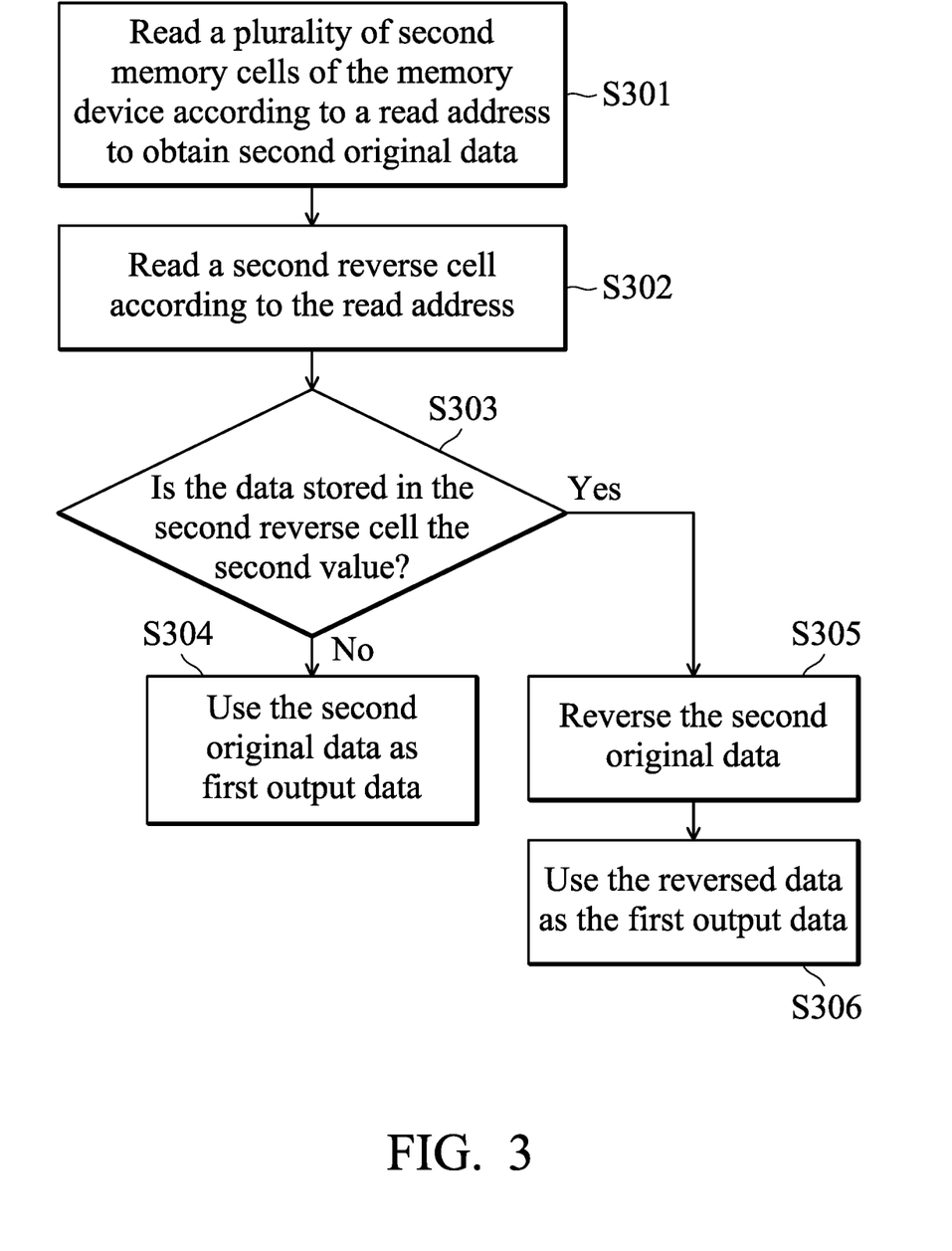
FIG. 3 is a flowchart of an exemplary embodiment of a read operation according to various aspects of the present disclosure.

FIG. 3 is a flowchart of an exemplary embodiment of a read operation according to various aspects of the present disclosure. First, a plurality of second memory cells of the memory device are read according to a read address to obtain second original data (step S301). In one embodiment, the read address is generated in step S101 of FIG. 1. In this embodiment, the second memory cells are coupled to the same word line. In other embodiments, the second memory cells read in step S304 may be the first memory cells which store the external data in step S204 or store the reversed data in step S206.

The data stored in a second reverse cell is read according to the read address (step S302). In this embodiment, the second reverse cell and the second memory cells are coupled to the same word line. Then, the data stored in the second reverse cell is determined whether to be the second value (step S303). When the data stored in the second reverse cell is not equal to the second value, it means that the second original data has not been processed by a reverse operation before the second original data stores in the second memory cells. Therefore, the second original data is used as first output data to output (step S304).

However, when the data stored in the second reverse cell is equal to the second value (e.g., 1), it means that the second original data has been processed by the reverse operation before the second original data stores in the second memory cells. Therefore, the second original data is reversed (step S305) to generate reversed data. The reversed data is used as the first output data and the first output data is output (step S306).

Figure 4:
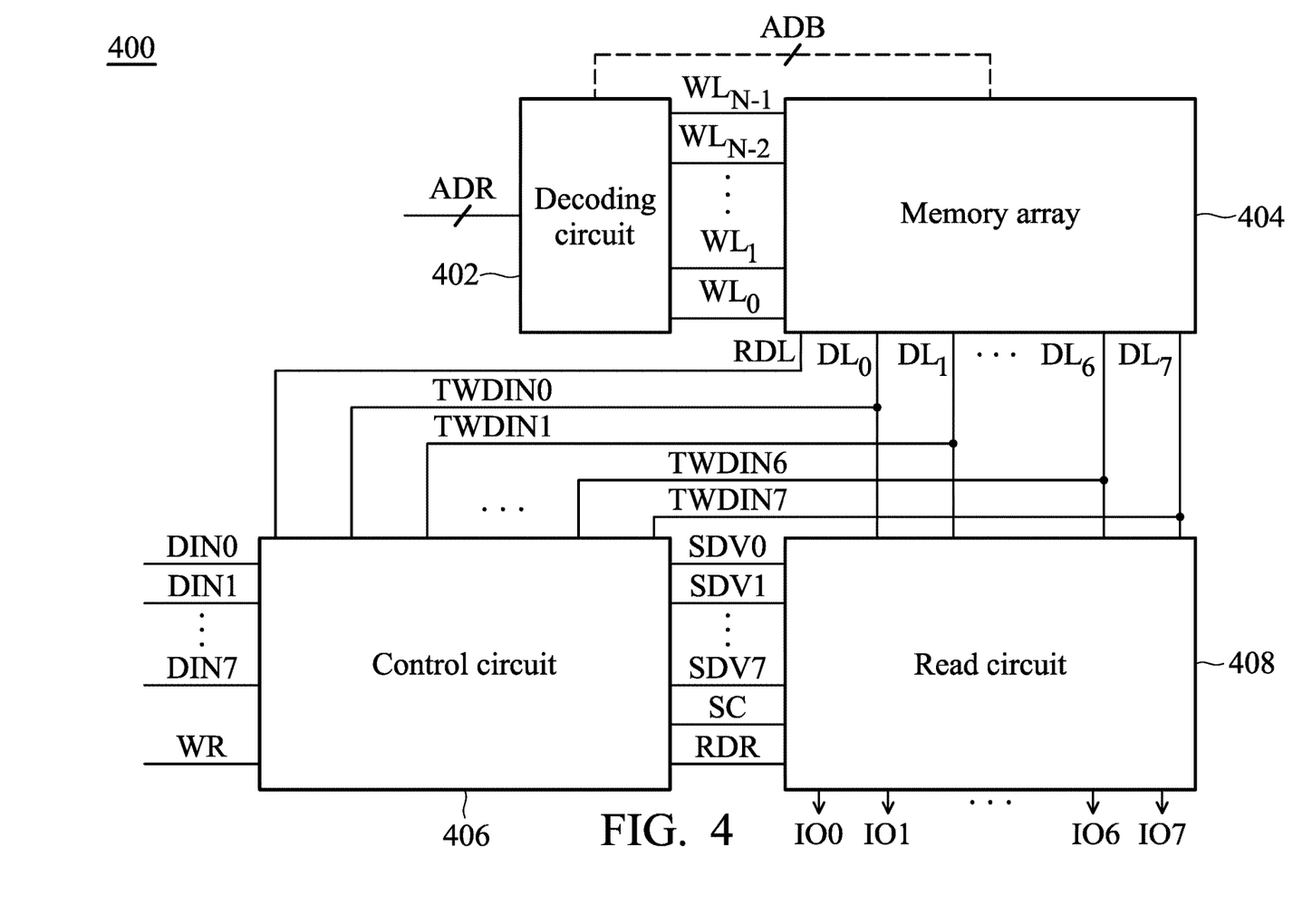
FIG. 4 is a schematic diagram of an exemplary embodiment of a memory device according to various aspects of the present disclosure.

FIG. 4 is a schematic diagram of an exemplary embodiment of a memory device according to various aspects of the present disclosure. The memory device 400 comprises a decoding circuit 402, a memory array 404, a control circuit 406 and a read circuit 408. The decoding circuit 402 decodes an address ADR to assert one of the word lines $WL_0$~$WL_{N-1}$.

The memory array 404 comprises the word lines $WL_0$~$WL_{N-1}$ and the data lines $DL_0$~$DL_7$. The number of data lines is not limited in the present disclosure. In other embodiments, the memory array 404 comprises more or fewer data lines. In this embodiment, the memory array 404 further comprises a plurality of memory cells (not shown). Each memory cell is coupled to one word line and one data line. In other embodiments, the memory array 404 further comprises a reverse data line RDL. In this case, the memory array 404 further comprises a plurality of reverse cells (not shown). Each reverse cell is coupled to a word line and the reverse data line RDL.

The control circuit 406 enters a write mode or a read mode according to an activation signal WR. For example, when the activation signal WR is at a first level (e.g., a high level), the control circuit 406 enters a write mode. In the write mode, the control circuit 406 receives external data DIN0~DIN7 and sends a control signal SC to direct the read circuit 408 to read a plurality of first memory cells of the memory array 404. At this time, the read circuit 408 may read the data in the data lines DL0~DL7 to provide output data SDV0~SDV7 to the control circuit 406. The control circuit 406 compares the external data DIN0~DIN7 and the output data SDV0~SDV7 to determine whether a number of specific cells among the first memory cells is higher than a predetermined value. When the number of specific cells among the first memory cells is not higher than the predetermined value, the control circuit 406 directly uses the external data DIN0~DIN7 as write data TWDIN0~TWDIN7 and writes the write data TWDIN0~TWDIN7 into the first memory cells via the data line $DL_0$~$DL_7$. When the number of specific cells among the first memory cells is higher than the predetermined value, the control circuit 406 reverses the external data DIN0~DIN7 to generate reversed data and uses the reversed data as the write data TWDIN0~TWDIN7. Then, the control circuit 406 writes the write data TWDIN0~TWDIN7 into the first memory cells via the data lines $DL_0$~$DL_7$. At this time, the control circuit 406 further writes the second value into a first reverse cell via the reverse data line RDL. In this case, the first reverse cell and the first memory cells are coupled to the same word line (e.g., $WL_0$).

When the activation signal WR is at a second level (e.g., a low level), the control circuit 406 enters a read mode. In the read mode, the control circuit 406 reads a second reverse cell and determines whether the data stored in the second reverse cell is equal to the second value. When the data stored in the second reverse cell is equal to the second value (e.g., 1), the control circuit 406 utilizes a control signal RDR to direct the read circuit 408 to reverse the data transmitted by the data lines $DL_0$~$DL_7$. The read circuit 408 outputs the reversed data (referred to as first output data) to the channels IO0~IO7. However, when the data stored in the second reverse cell is not equal to the second value, the control circuit 406 directs the read circuit 408 to directly output data transmitted by the data lines $DL_0$~$DL_7$ to the channels IO0~IO7. In one embodiment, when the data stored in the second reverse cell is equal to the second value, the control circuit 406 sets the control signal RDR at a high level. When the data stored in the second reverse cell is equal to the first value, the control circuit 406 sets the control signal RDR at a low level.

The read circuit 408 determines whether to reverse the data in the data lines $DL_0$~$DL_7$ according to the control signal RDR. For example, when the control signal RDR is at a first specific level (e.g., a high level), the read circuit 408 reverses the data in the data lines $DL_0$~$DL_7$ and outputs the reversed data to the channels IO0~IO7. However, when the control signal RDR is not at the first specific level, the read circuit 408 does not reverse the data in the data lines $DL_0$~$DL_7$. In this case, the read circuit 408 directly outputs the data in the data lines $DL_0$~$DL_7$ to the channels IO0~IO7.

In other embodiments, the read circuit 408 determines whether to provide the output data SDV0~SDV7 to the control circuit 406 according to the control signal SC. For example, when the control signal is at a second specific level (e.g., a low level), the read circuit 408 does not provide the output data SDV0~SDV7 to the control circuit 406. At this time, the read circuit 408 determines whether to reverse the data in the data lines $DL_0$~$DL_7$ according to the control signal RDR. When the control signal SC is not at the second specific level, the read circuit 408 provides the output data SDV0~SDV7 to the control circuit 406. In one embodiment, the read circuit 408 comprises a sample-hold circuit (not shown) to maintain the data in the data lines $DL_0$~$DL_7$.

Figure 5A:
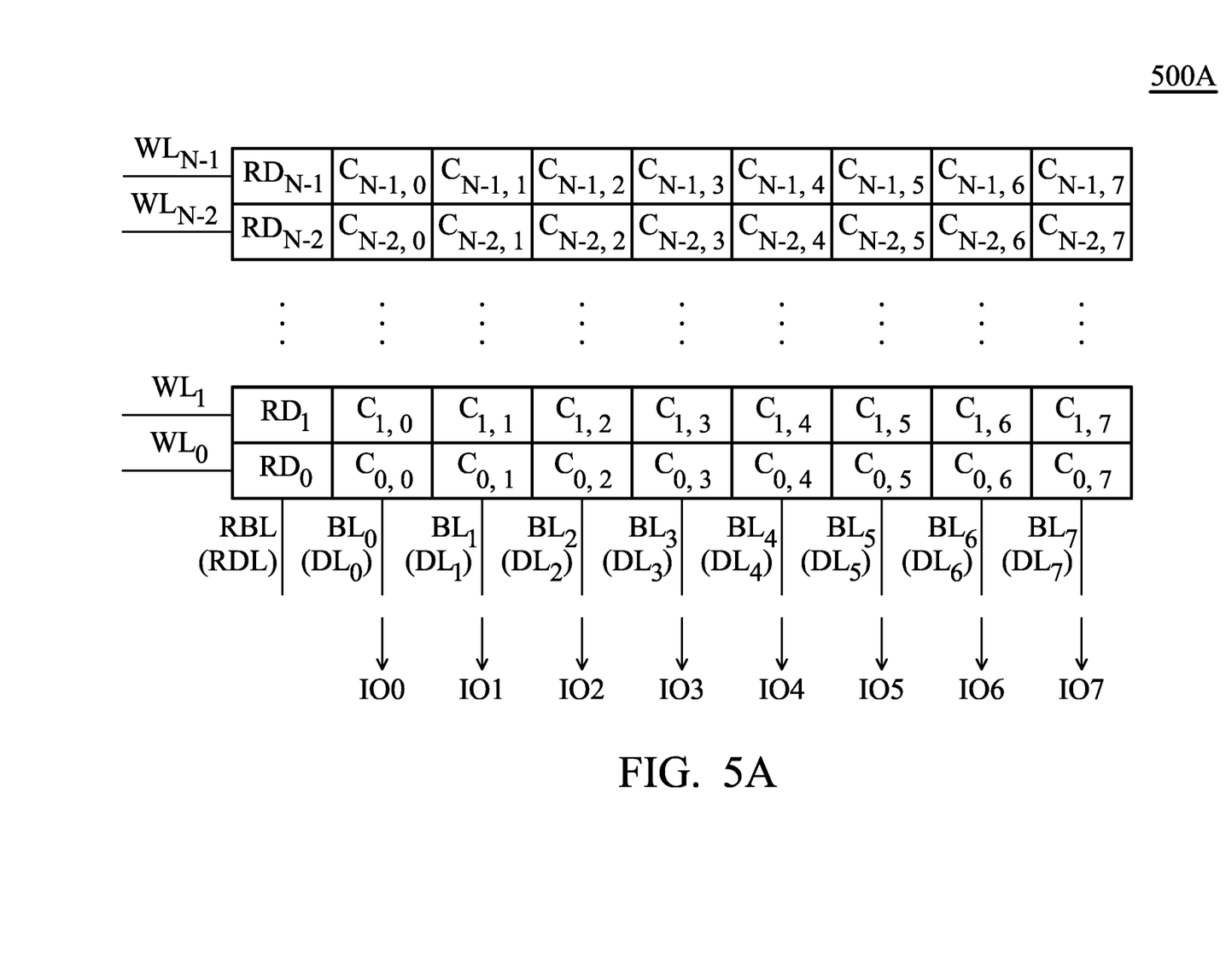
FIG. 5A is a schematic diagram of an exemplary embodiment of a memory array according to various aspects of the present disclosure.

FIG. 5A is a schematic diagram of an exemplary embodiment of a memory array according to various aspects of the present disclosure. The memory array 500A comprises memory cells $C_{0,0}$~$C_{N-1,7}$, but the disclosure is not limited thereto. In other embodiments, the memory array 500A may comprise more or fewer memory cells. The memory cells arranged in a row (a horizontal direction) are coupled to the same word line and coupled to different bit lines. For example, the memory cells $C_{0,0}$, $C_{0,1}$, $C_{0,2}$, $C_{0,3}$, $C_{0,4}$, $C_{0,5}$, $C_{0,6}$, and $C_{0,7}$ are coupled to the word line $WL_0$ and coupled to the bit lines $BL_0$~$BL_7$, respectively. Additionally, the memory cells arranged in a column (a vertical direction) are coupled to the same bit line and coupled to different word lines. For example, the memory cells $C_{0,0}$, $C_{1,0}$, ..., $C_{N-2,0}$, and $C_{N-1,0}$ are coupled to the bit line $BL_0$ and the word lines $WL_0$, $WL_1$, ..., $WL_{N-2}$, and $WL_{N-1}$. In one embodiment, the bit lines $BL_0$~$BL_7$ uses as the data lines $DL_0$~$DL_7$.

In this embodiment, the memory cells arranged in the same column output data to the same channel. For example, the memory cells $C_{0,0}$, $C_{1,0}$, ..., $C_{N-2,0}$, and $C_{N-1,0}$ output data to the channel IO0, the memory cells $C_{0,1}$, $C_{1,1}$, ..., $C_{N-2,1}$, and $C_{N-1,1}$ output data to the channel IO1, and the memory cells $C_{0,7}$, $C_{1,7}$, ..., $C_{N-2,7}$, and $C_{N-1,7}$ output data to the channel IO7.

In other embodiments, the memory array 500A further comprises reverse cells $RD_0$~$RD_{N-1}$. The reverse cells $RD_0$~$RD_{N-1}$ are coupled to the word lines $WL_0$~$WL_7$, respectively, and coupled to the bit line RBL. The bit line RBL uses as the reverse data line RDL. In this embodiment, the data stored in the reverse cells $RD_0$~$RD_{N-1}$ indicates whether the data stored in the corresponding memory cells has been processed by a reverse operation. For example, when the data of the reverse cell $RD_0$ is the first value (e.g., 0), it means that the data of the corresponding memory cells (e.g., $C_{0,0}$, $C_{0,1}$, $C_{0,2}$, $C_{0,3}$, $C_{0,4}$, $C_{0,5}$, $C_{0,6}$, and $C_{0,7}$) which are coupled to a corresponding word line (e.g., $WL_0$) coupled to the reverse cell $RD_0$ has not been processed by the reverse operation. Therefore, the data stored in the memory cells (e.g., $C_{om}$, $C_{0,1}$, $C_{0,2}$, $C_{0,3}$, $C_{0,4}$, $C_{0,5}$, $C_{0,6}$, and $C_{0,7}$) can directly be output to the channels IO0~IO7. However, when the data of the reverse cell $RD_0$ is the second value (e.g., 1), it means that the data of the corresponding memory cells (e.g., $C_{0,0}$, $C_{0,1}$, $C_{0,2}$, $C_{0,3}$, $C_{0,4}$, $C_{0,5}$, $C_{0,6}$, and $C_{0,7}$) which are coupled to a corresponding word line (e.g., $WL_0$) coupled to the reverse cell $RD_0$ has been processed by the reverse operation. Therefore, the data stored in the memory cells (e.g., $C_{0,0}$, $C_{0,1}$, $C_{0,2}$, $C_{0,3}$, $C_{0,4}$, $C_{0,5}$, $C_{0,6}$, and $C_{0,7}$) needs to be reversed and then the reversed data is output to the channels IO0~IO7

Figure 5B:
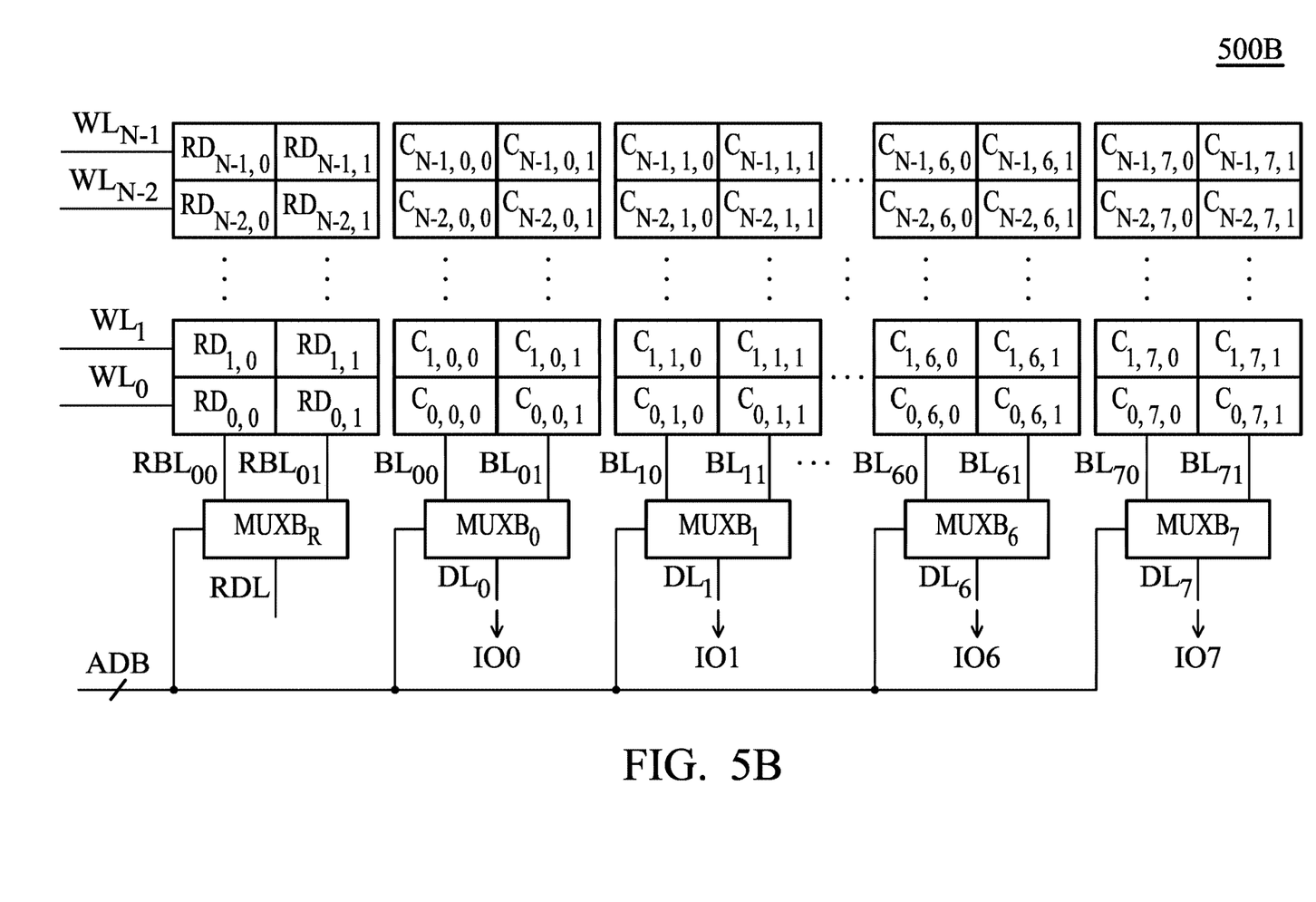
FIG. 5B is a schematic diagram of another exemplary embodiment of the memory array according to various aspects of the present disclosure.

FIG. 5B is a schematic diagram of another exemplary embodiment of the memory array according to various aspects of the present disclosure. The memory array 500B comprises memory cells $C_{0,0,0}$~$C_{N-1,7,0}$. In each row (extended along a horizontal direction), the memory cells are coupled to the same word line and coupled to different bit lines. For example, the memory cells $C_{0,0,0}$, $C_{0,0,1}$, $C_{0,1,0}$, $C_{0,1,1}$, ..., $C_{0,6,0}$, $C_{0,6,1}$, $C_{0,7,0}$, and $C_{0,7,1}$ are coupled to the word line $WL_0$ and coupled to bit lines $BL_{00}$, $BL_{01}$, $BL_{10}$, $BL_{11}, \ldots, BL_{60}, BL_{61}, BL_{70}$, and $BL_{71}$. Furthermore, in each column (extended along a vertical direction), the memory cells are coupled to the same bit line and coupled to different word lines. For example, the memory cells $C_{0,0,0}, C_{1,0,0}, \ldots, C_{N-2,0,0}$, and $C_{N-1,0,0}$ are coupled to the bit line $BL_{00}$ and coupled to word lines $WL_0 \sim WL_{N-1}$.

In this embodiment, the memory array 500B further comprises multiplexers $MUXB_0 \sim MUXB_7$. Each of the multiplexers $MUXB_0 \sim MUXB_7$ is coupled to a bit-line set. Each bit-line set comprises a first bit line and a second bit line. In this case, each of the multiplexers $MUXB_0 \sim MUXB_7$ outputs the data in the first bit line or in the second bit line to a corresponding data line.

Taking the multiplexers $MUXB_0$ and $MUXB_7$ as an example, the multiplexer $MUXB_0$ is coupled to the bit lines $BL_{00}$ and $BL_{01}$. The multiplexer $MUXB_0$ outputs the data in the bit line $BL_{00}$ (referred to as a first bit line) or in the bit line $BL_{01}$ (referred to as a second bit line) to the data line $DL_0$ according to an address control signal ADB. In this case, the data in the data line $DL_0$ is provided to the channel IO0. Additionally, the multiplexer $MUXB_7$ is coupled to the bit lines $BL_{70}$ and $BL_{71}$. The multiplexer $MUXB_7$ outputs the data in the bit line $BL_{70}$ (referred to as a first bit line) or in the bit line $BL_{71}$ (referred to as a second bit line) to the data line $DL_7$ according to the address control signal ADB. In this case, the data in the data line $DL_7$ is provided to the channel IO7. In other embodiments, each of the bit-line sets coupled to the multiplexers $MUXB_0 \sim MUXB_7$ may comprise a different number of bit lines. For example, each of the bit-line sets may comprise four, eight, or sixteen bit lines. In this case, each bit line is coupled to a corresponding multiplexer.

In one embodiment, the memory array 500B further comprises reverse cells $RD_{0,0} \sim RD_{N-1,0}$ and $RD_{0,1} \sim RD_{N-1,1}$, and a multiplexer $MUXB_R$. The reverse cells $RD_{0,0} \sim RD_{N-1,0}$ are coupled to the bit line $RBL_{00}$ and coupled to the word lines $WL_0 \sim WL_{N-1}$. The reverse cells $RD_{0,1} \sim RD_{N-1,1}$ are coupled to the bit line $RBL_{01}$ and coupled to the word lines $WL_0 \sim WL_{N-1}$. Since the functions of the reverse cells $RD_{0,0} \sim RD_{N-1,0}$ and $RD_{0,1} \sim RD_{N-1,1}$ are the same, the reverse cells $RD_{0,0} \sim RD_{N-1,0}$ are given as an example.

The data stored in the reverse cells $RD_{0,0} \sim RD_{N-1,0}$ which are coupled to the bit line $RBL_{00}$ may be used to indicate whether the data stored in the memory cells which are coupled to the first bit lines (e.g., $BL_{00}, BL_{10}, \ldots, BL_{60}$, and $BL_{70}$), respectively has been processed by a reverse operation. The first bit lines (e.g., $BL_{00}, BL_{10}, \ldots, BL_{60}$, and $BL_{70}$) are coupled to the multiplexers $MUXB_0 \sim MUXB_7$, respectively. Taking the reverse cells $RD_{0,0}$ and $RD_{N-1,0}$ as an example, when the data stored in the reverse cell $RD_{0,0}$ is equal to the first value (e.g., 0), it means that the data stored in the memory cells (e.g., $C_{0,0,0}, C_{0,1,0}, \ldots, C_{0,6,0}$, and $C_{0,7,0}$) coupled to the word line $WL_0$ and the first bit lines has not been processed by a reverse operation. Similarly, when the data stored in the reverse cell $RD_{N-1,0}$ is equal to the first value, it means that the data stored in the memory cells (e.g., $C_{N-1,0,0}, C_{N-1,1,0}, \ldots, C_{N-1,6,0}$, and $C_{N-1,7,0}$) coupled to the word line $WL_{N-1}$ and the first bit lines has not been processed by a reverse operation.

However, when the data stored in the reverse cell $RD_{0,0}$ is equal to the second value (e.g., 1), it means that the data stored in the memory cells (e.g., $C_{0,0,0}, C_{0,1,0}, \ldots, C_{0,6,0}$, and $C_{0,7,0}$) coupled to the word line $WL_0$ and the first bit lines has been processed by a reverse operation. Similarly, when the data stored in the reverse cell $RD_{N-1,0}$ is equal to the second value, it means that the data stored in the memory cells (e.g., $C_{N-1,0,0}, C_{N-1,1,0}, \ldots, C_{N-1,6,0}$, and $C_{N-1,7,0}$) coupled to the word line $WL_{N-1}$ and the first bit lines has been processed by a reverse operation.

In this embodiment, the multiplexer $MUXB_R$ is coupled to the bit lines $RBL_{00}$ and $RBL_{01}$. The multiplexer $MUXB_R$ outputs the data in the bit line $RBL_{00}$ or $RBL_{01}$ to the reverse data line RDL according to the address control signal ADB. For example, when the address control signal ADB is at a first level (e.g., a low level), the multiplexer $MUXB_R$ outputs the data in the bit line $RBL_{00}$ to the reverse data line RDL. At this time, the multiplexers $MUXB_0 \sim MUXB_7$ output data in the first bit lines ($BL_{00}, BL_{10}, \ldots, BL_{60}$, and $BL_{70}$) to the data lines $DL_0 \sim DL_7$, respectively. When the address control signal ADB is at a second level (e.g., a high level), the multiplexer $MUXB_R$ outputs the data in the bit line $RBL_{01}$ to the reverse data line RDL. At this time, the multiplexers $MUXB_1 \sim MUXB_7$ output data in the second bit lines ($BL_{01}, BL_{11}, \ldots, BL_{61}$, and $BL_{71}$) to the data lines $DL_0 \sim DL_7$, respectively.

Figure 6:
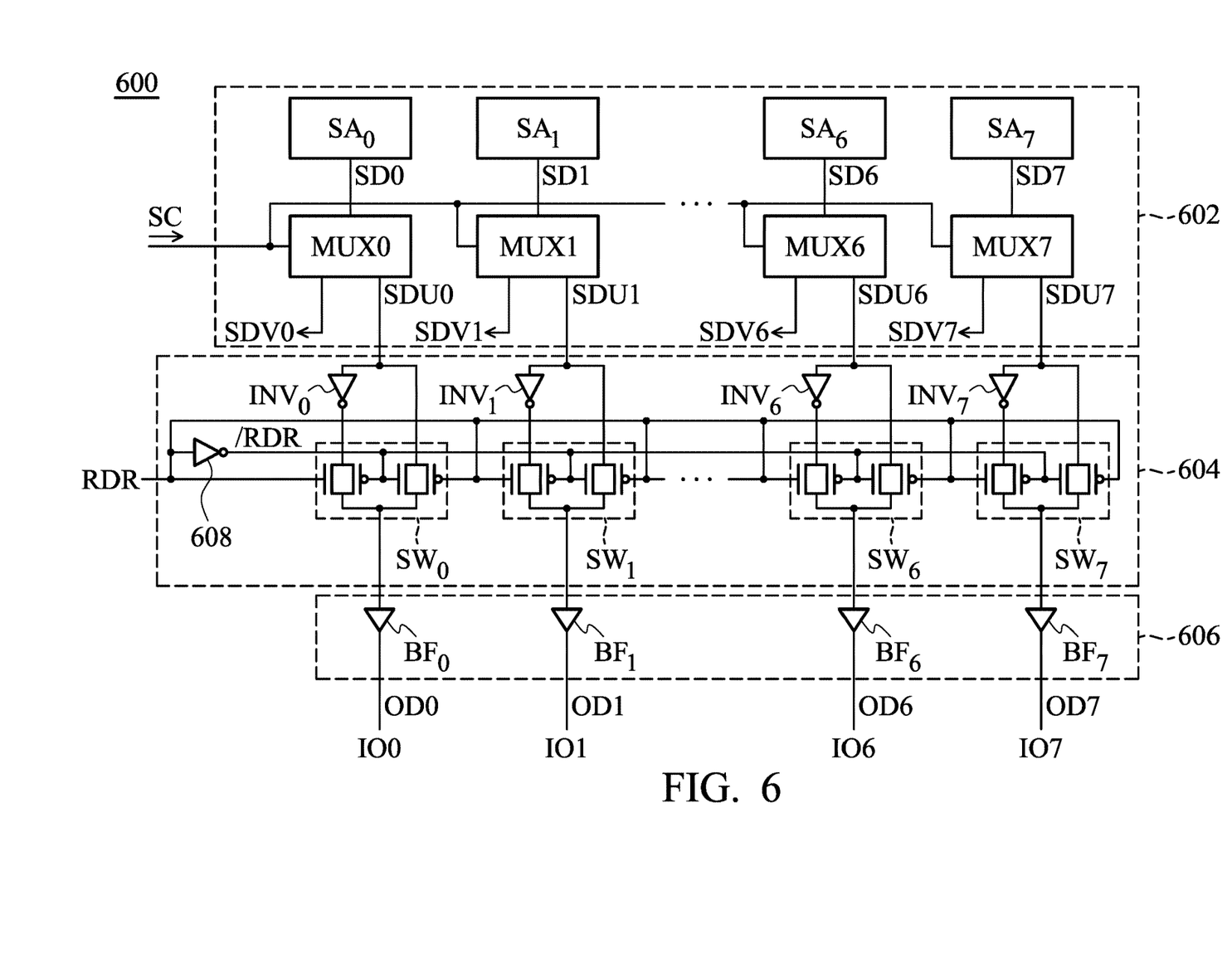
FIG. 6 is a schematic diagram of an exemplary embodiment of a read circuit according to various aspects of the present disclosure.

FIG. 6 is a schematic diagram of an exemplary embodiment of a read circuit according to various aspects of the present disclosure. The read circuit 600 comprises an amplifier module 602, a reverse module 604 and a buffer module 606. The amplifier module 602 is configured to amplify the data transmitted by the data lines $DL_0 \sim DL_7$. In one embodiment, the amplifier module 602 comprises a plurality of sense amplifiers $SA_0 \sim SA_7$ and multiplexers $MUX_0 \sim MUX_7$. The sense amplifiers $SA_0 \sim SA_7$ are coupled to the data lines $DL_0 \sim DL_7$, respectively and amplified the data in the data lines $DL_0 \sim DL_7$ to generate the original data SD0~SD7. The multiplexers $MUX_0 \sim MUX_7$ output the original data SD0~SD7 to the control circuit 406 or the reverse module 604 according to the control signal SC. For example, when the control signal SC is at a second specific level (e.g., a low level), the multiplexers $MUX_0 \sim MUX_7$ output the original data SD0~SD7 provided as the output data SDU0~SDU7. The output data SDU0~SDU7 is output to the reverse module 604. At this time, the reverse module 604 determines whether to reverse the output data SDU0~SDU7 according to the control signal RDR. When the control signal SC is not at the second specific level, the multiplexers $MUX_0 \sim MUX_7$ output the original data SD0~SD7 provided as the output data SDV0~SDV7. The output data SDV0~SDV7 is output to the control circuit 406. In this embodiment, when the control signal SC is not at the second specific level, the multiplexers $MUX_0 \sim MUX_7$ provide the output data SDV0~SDV7 to a sample-hold circuit (not shown) to maintain the output data SDV0~SDV7. Therefore, even if the data in the data lines $DL_0 \sim DL_7$ is changed, the output data SDV0~SDV7 has not changed.

The reverse module 604 determines whether to reverse the output data SDU0~SDU7 according to the control signal RDR. For example, when the control signal RDR is at a first specific level, the reverse module 604 reverses the output data SDU0~SDU7 to generate reversed data and outputs the reversed data to the buffer module 606. However, when the control signal RDR is not at the first specific level, the reverse module 604 does not reverse the output data SDU0~SDU7. In this case, the reverse module 604 directly outputs the output data SDU0~SDU7 to the buffer module 606.

In this embodiment, the reverse module 604 comprises inverters $INV_0 \sim INV_7$ and switches $SW_0 \sim SW_7$. The inverters $INV_0 \sim INV_7$ is configured to reverse the output data SDU0~SDU7. The switches $SW_0 \sim SW_7$ receive the reversed data generated by the inverters $INV_0 \sim INV_7$ and the output data SDU0~SDU7 provided from the multiplexers $MUX_0 \sim MUX_7$. The switches $SW_0 \sim SW_7$ output the reversed data generated by the inverters $INV_0 \sim INV_7$ or the output data $SDU0 \sim SDU7$ provided from the multiplexers $MUX_0 \sim MUX_7$ according to the control signal RDR. For example, when the control signal RDR is at a first specific level (e.g., a high level), the switches $SW_0 \sim SW_7$ output the reversed data generated by the inverters $INV_0 \sim INV_7$, respectively. When the control signal RDR is not at the first specific level, the switches $SW_0 \sim SW_7$ output the output data $SDU0 \sim SDU7$ provided from the multiplexers $MUX_0 \sim MUX_7$. The structures of the switches $SW_0 \sim SW_7$ are not limited in the present disclosure. In one embodiment, each of the switches $SW_0 \sim SW_7$ is a multiplexer.

In another embodiment, each of the switches $SW_0 \sim SW_7$ comprises a first transmission gate and a second transmission gate. In this case, the reverse module 604 further comprises an inverter 608. The inverter 608 inverts the control signal RDR to generate an inverted signal /RDR. When the control signal RDR is at a first specific level (e.g., a high level), since the inverted signal /RDR is not at the first specific level, the first transmission gates of the switches $SW_0 \sim SW_7$ are turned on to output the reversed data generated by the inverters $INV_0 \sim INV_7$. However, when the control signal RDR is not at the first specific level (for example, the control signal RDR is at a low level), since the inverted signal /RDR is at the first specific level, the second transmission gates of the switches $SW_0 \sim SW_7$ are turned on to output the output data $SDU0 \sim SDU7$ of the multiplexers $MUX_0 \sim MUX_7$.

The buffer module 606 is configured to enhance the driving capability of the output data of the reverse module 604. In this embodiment, the buffer module 606 comprises buffers $BF_0 \sim BF_7$. The buffers $BF_0 \sim BF_7$ enhance the output of the switches $SW_0 \sim SW_7$ to generate enhanced results OD0~OD7 and provides the enhanced results OD0~OD7 to the channels IO0~IO7.

Figure 7:
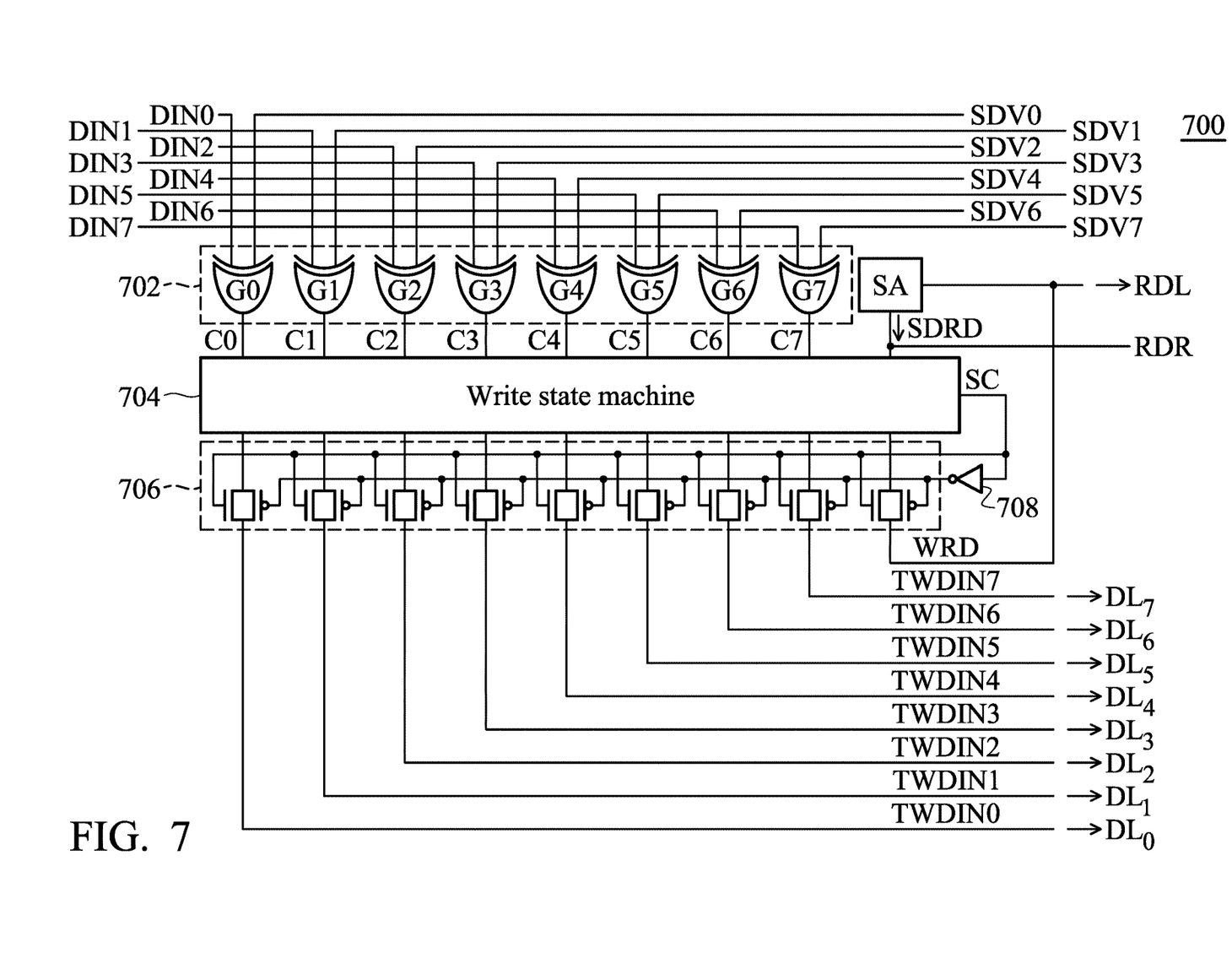
FIG. 7 is a schematic diagram of an exemplary embodiment of a control circuit according to various aspects of the present disclosure.

FIG. 7 is a schematic diagram of an exemplary embodiment of a control circuit according to various aspects of the present disclosure. The control circuit 700 comprises a comparing module 702, a write state machine 704 and a transmission module 706. The comparing module 702 is configured to compare the output data SDV0~SDV7 and the external data DIN0~DIN7 to generate compared results C0~C7. In this embodiment, the comparing module 702 comprises logic gates G0~G7. Each of the logic gates G0~G7 compares one of the output data SDV0~SDV7 and one of the external data DIN0~DIN7. For example, the logic gate G0 compares the output data SDV0 and the external data DIN0 to generate the compared result C0. The logic gate G1 compares the output data SDV1 and the external data DIN1 to generate the compared result C1. In one embodiment, the logic gates G0~G7 are XOR gates.

The write state machine 704 determines whether the number of values among the output data SDV0~SDV7 is higher than a predetermined value according to the compared results C0~C7. Each of the values would be changed from the first value to the second value in response to the external data replacing the output data SDV0~SDV7. When the number of values among the output data SDV0~SDV7 is not higher than the predetermined value, the write state machine 704 directly uses the external data DIN0~DIN7 as the write data TWDIN0~TWDIN7 and outputs the write data TWDIN0~TWDIN7 to the transmission module 706. However, when the number of values among the output data SDV0~SDV7 is higher than the predetermined value, the write state machine 704 reverses the external data DIN0~DIN7 to generate reversed data. The write state machine 704 uses the reversed data as the write data TWDIN0~TWDIN7 and outputs the write data TWDIN0~TWDIN7 to the transmission module 706.

In this embodiment, the write state machine 704 further utilizes a sense amplifier SA to read the data stored in a specific reverse cell coupled to the reverse data line RDL. The sense amplifier SA amplifies the data stored in the specific reverse cell to generate amplified data SDRD. In this case, when the write state machine 704 directly uses the external data DIN0~DIN7 as the write data TWDIN0~TWDIN7, the write state machine 704 determines whether the amplified data SDRD is the first value (e.g., 0). When the amplified data SDRD is the first value, the write state machine 704 may not change the data stored in the specific reverse cell. However, when the amplified data SDRD is not the first value, the write state machine 704 sets the write-reverse data WRD to the first value and writes the write-reverse data WRD to the specific reverse cell.

In other embodiments, when the write state machine 704 reverses the external data DIN0~DIN7 and uses the reversed data as the write data TWDIN0~TWDIN7, the write state machine 704 determines whether the amplified data SDRD is the second value (e.g., 1). When the amplified data SDRD is the second value, the write state machine 704 may not change the data stored in the specific reverse cell. However, when the amplified data SDRD is not the second value, the write state machine 704 sets the write-reverse data WRD to the second value and writes the write-reverse data WRD to the specific reverse cell.

The transmission module 706 determines whether to transmit the write data TWDIN0~TWDIN7 to the data lines $DL_0 \sim DL_7$ according to the control signal SC. For example, when the control signal SC is at a second specific level (e.g., a low level), the transmission module 706 does not transmit the write data TWDIN0~TWDIN7 to the data lines $DL_0 \sim DL_7$. At this time, the transmission module 706 does not transmit the write-reverse data WRD to the reverse data line RDL. When the control signal SC is not at the second specific level (for example, the control signal SC is at a high level), the transmission module 706 transmits the write data TWDIN0~TWDIN7 to the data lines $DL_0 \sim DL_7$. At this time and transmits the write-reverse data WRD to the reverse data line RDL.

The structure of transmission module 706 is not limited in the present disclosure. In one embodiment, the transmission module 706 comprises a plurality of transmission gates. In this case, each transmission gate is coupled between the write state machine 704 and one data line. When the control signal SC is not at the second specific level, all of the transmission gates in the transmission module 706 are turned on to transmit the write data TWDIN0~TWDIN7 to the data lines $DL_0 \sim DL_7$. When the control signal SC is at the second specific level (e.g., a low level), all of the transmission gates in the transmission module 706 are turned off to stop transmitting the write data TWDIN0~TWDIN7 to the data lines $DL_0 \sim DL_7$. In this case, the control circuit 700 further comprises an inverter 708. The inverter 708 inverts the control signal SC to generate an inverted result and provides the inverted result to the transmission module 706 to control the transmission gates in the transmission module 706.

Data access methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a memory device for practicing the methods. The access methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a memory device for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It should also be understood that terms such as those defined in commonly used dictionaries should be interpreted as having a meaning that is consistent with their meaning in the context of the relevant art and will not be interpreted in an idealized or overly formal sense, unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An access method for a memory device, comprising:
receiving first external data;
reading a plurality of first memory cells of the memory device according to a first write address to obtain first original data;
comparing the first external data and the first original data to determine whether the number of first specific cells among the first memory cells is higher than a first predetermined value, wherein a value of each of the first specific cells would be changed from a first value to a second value in response to the first external data being written into the first memory cells;
writing the first external data into the first memory cells to replace the first original data in response to the number of first specific cells not being higher than the first predetermined value;
reversing the first external data to generate first reversed data and writing the first reversed data into the first memory cells to replace the first original data in response to the number of first specific cells being higher than the first predetermined value;
receiving second external data;
reading a plurality of second memory cells of the memory device according to a second write address to obtain second original data;
comparing the second external data and the second original data to determine whether the number of second specific cells among the second memory cells is higher than a second predetermined value, wherein a value of each of the second specific cells would be changed from the first value to the second value in response to the second external data being written into the second memory cells;
writing the second external data into the second memory cells to replace the second original data in response to the number of second specific cells not being higher than the second predetermined value; and
reversing the second external data to generate second reversed data and writing the second reversed data into the second memory cells to replace the second original data in response to the number of second specific cells being higher than the second predetermined value,
wherein the first predetermined value and the second predetermined value are the same.

2. The access method as claimed in claim 1, wherein the first value is 0, and the second value is 1.

3. The access method as claimed in claim 1, further comprising:
setting a value of a first reverse cell of the memory device to the second value according to the first write address in response to the number of first specific cells being higher than the first predetermined value.

4. The access method as claimed in claim 3, wherein the first reverse cell and the first memory cells are coupled to a first word line.

5. The access method as claimed in claim 3, further comprising:
setting the value of the first reverse cell to the first value according to the first write address in response to the number of first specific cells not being higher than the first predetermined value.

6. The access method as claimed in claim 5, further comprising:
reading a plurality of third memory cells of the memory device according to a first read address to obtain third original data;
reading a second reverse cell according to the first read address;
determining whether a value of the second reverse cell is equal to the second value;
reversing the third original data to generate first output data in response to the value of the second reverse cell being equal to the second value; and
using the third original data as the first output data in response to the value of the second reverse cell not being equal to the second value.

7. The access method as claimed in claim 6, wherein the second reverse cell and the third memory cells are coupled to a second word line.

8. The access method as claimed in claim 7, further comprising:
reading a plurality of fourth memory cells of the memory device according to a second read address to obtain fourth original data;
reading a third reverse cell according to the second read address;
determining whether a value of the third reverse cell is equal to the second value;
reversing the fourth original data to generate second output data in response to the value of the third reverse cell being equal to the second value; and
using the fourth original data as the second output data in response to the value of the third reverse cell not being equal to the second value.

9. The access method as claimed in claim 8, wherein the third reverse cell and the fourth memory cells are coupled to the second word line.

10. The access method as claimed in claim 9, wherein the second reverse cell and the third reverse cell are coupled to different bit lines.

11. A memory device comprising:
a memory array;
a read circuit reading a plurality of first memory cells of the memory array according to a first write address to generate first original data, and reading a plurality of second memory cells of the memory array according to a second write address to generate second original data; and
a control circuit comparing first external data and the first original data to determine whether the number of first specific cells among the first memory cells is higher than a first predetermined value, wherein the value of each of the first specific cells would be changed from a first value to a second value in response to the first external data being written into the first memory cells,
wherein:
in response to the number of first specific cells not being higher than the first predetermined value, the control circuit writes the first external data into the first memory cells,
in response to the number of first specific cells being higher than the first predetermined value, the control circuit reverses the first external data to generate first reversed data and writes the first reversed data into the first memory cells,
the control circuit further compares second external data and the second original data to determine whether the number of second specific cells among the second memory cells is higher than a second predetermined value, wherein the value of each of the second specific cells would be changed from the first value to the second value in response to the second external data being written into the second memory cells,
in response to the number of second specific cells not being higher than the second predetermined value, the control circuit writes the second external data into the second memory cells,
in response to the number of second specific cells being higher than the second predetermined value, the control circuit reverses the second external data to generate second reversed data and writes the second reversed data into the second memory cells, and
the first predetermined value and the second predetermined value are the same.

12. The memory device as claimed in claim 11, wherein the first value is 0, and the second value is 1.

13. The memory device as claimed in claim 11, wherein in response to the number of first specific cells being higher than the first predetermined value, the control circuit sets data stored in a first reverse cell of the memory array to the second value according to the first write address.

14. The memory device as claimed in claim 13, wherein the first reverse cell and the first memory cells are coupled to a first word line.

15. The memory device as claimed in claim 13, wherein in response to the number of first specific cells not being higher than the first predetermined value, the control circuit sets the data stored in the first reverse cell to the first value according to the first write address.

16. The memory device as claimed in claim 15, wherein:
the read circuit reads a plurality of third memory cells of the memory array according to a first read address to obtain third original data, and the control circuit reads a second reverse cell of the memory array according to the first read address and determines whether data stored in the second reverse cell is equal to the second value,
in response to the data stored in the second reverse cell being equal to the second value, the read circuit reverses the third original data to generate first output data,
in response to the data stored in the second reverse cell not being equal to the second value, the read circuit uses the third original data as the first output data.

17. The memory device as claimed in claim 16, wherein the second reverse cell and the third memory cells are coupled to a second word line.

18. The memory device as claimed in claim 17, wherein:
the read circuit reads a plurality of fourth memory cells of the memory array according to a second read address to obtain fourth original data, and the control circuit reads a third reverse cell of the memory array according to the second read address and determines whether data stored in the third reverse cell is equal to the second value,
in response to the data stored in the third reverse cell being equal to the second value, the read circuit reverses the fourth original data to generate second output data,
in response to the data stored in the third reverse cell not being equal to the second value, the read circuit uses the fourth original data as the second output data.

19. The memory device as claimed in claim 18, wherein the third reverse cell and the fourth memory cells are coupled to the word line.

20. The memory device as claimed in claim 19, wherein the second reverse cell and the third reverse cell are coupled to different bit lines.

* * * * *